US010395790B2

(12) United States Patent
Jung et al.

(10) Patent No.: US 10,395,790 B2
(45) Date of Patent: Aug. 27, 2019

(54) TRANSPARENT CONDUCTOR AND ELECTRONIC DEVICE INCLUDING THE SAME

(71) Applicant: SAMSUNG ELECTRONICS CO., LTD., Suwon-si, Gyeonggi-do (KR)

(72) Inventors: Doh Won Jung, Seoul (KR); Hee Jung Park, Suwon-si (KR); Kimoon Lee, Seoul (KR); Yoon Chul Son, Hwaseong-si (KR); Woojin Lee, Suwon-si (KR); Youngjin Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 772 days.

(21) Appl. No.: 14/539,408

(22) Filed: Nov. 12, 2014

(65) Prior Publication Data

US 2015/0340123 A1    Nov. 26, 2015

(30) Foreign Application Priority Data

May 23, 2014   (KR) .................. 10-2014-0062572

(51) Int. Cl.
| | | |
|---|---|---|
| *H01B 1/02* | (2006.01) | |
| *H01B 1/06* | (2006.01) | |
| *C01B 35/04* | (2006.01) | |
| *G06F 3/041* | (2006.01) | |
| *H01L 31/0224* | (2006.01) | |

(52) U.S. Cl.
CPC ............... *H01B 1/02* (2013.01); *C01B 35/04* (2013.01); *H01B 1/06* (2013.01); *H01L 31/022466* (2013.01); *C01P 2006/40* (2013.01); *C01P 2006/60* (2013.01); *G06F 3/041* (2013.01); *G06F 2203/04103* (2013.01); *Y10T 428/256* (2015.01)

(58) Field of Classification Search
CPC .......... H01B 5/002; H01B 1/02; C01B 35/04; G06F 3/041
See application file for complete search history.

(56) References Cited

U.S. PATENT DOCUMENTS

| | | | |
|---|---|---|---|
| 4,894,302 A | 1/1990 | Hoffman et al. | |
| 7,250,454 B2 * | 7/2007 | Yadav | B01J 12/005 |
| | | | 523/105 |
| 8,138,489 B2 | 3/2012 | Tanaka et al. | |
| 8,404,090 B2 | 3/2013 | Camire et al. | |
| 2006/0251954 A1 | 11/2006 | Merzougui et al. | |

(Continued)

FOREIGN PATENT DOCUMENTS

| | | |
|---|---|---|
| JP | 08-298097 A | 11/1996 |
| JP | 2593137 B2 | 12/1996 |

(Continued)

OTHER PUBLICATIONS

Brewer et al. "A Study of the Refractory Borides". Journal of the American Ceramic Society, vol. 34, Issue 6, (1951); pp. 173-179.*

(Continued)

*Primary Examiner* — Prashant J Khatri
(74) *Attorney, Agent, or Firm* — Cantor Colburn LLP

(57) ABSTRACT

A transparent conductor including a Group 5 transition metal and boron, wherein the compound has a layered structure.

6 Claims, 14 Drawing Sheets

(56) References Cited

U.S. PATENT DOCUMENTS

| | | |
|---|---|---|
| 2008/0261094 A1 | 10/2008 | Licht et al. |
| 2010/0052497 A1 | 3/2010 | Walker, Jr. et al. |
| 2010/0294350 A1* | 11/2010 | Ko .................. H01G 9/2031 136/255 |
| 2010/0301737 A1 | 12/2010 | Mann |
| 2012/0168705 A1 | 7/2012 | Liu et al. |
| 2013/0134948 A1 | 5/2013 | Licht |
| 2015/0140331 A1* | 5/2015 | Salguero ............ C01B 35/04 428/402 |

FOREIGN PATENT DOCUMENTS

| | | |
|---|---|---|
| JP | 2648167 B2 | 5/1997 |
| JP | 10-083818 A | 3/1998 |
| JP | 11-214242 A | 8/1999 |
| JP | 2000-299107 A | 10/2000 |
| JP | 2007-246971 A | 9/2007 |
| JP | 2008-153122 A | 7/2008 |
| JP | 2008-251190 A | 10/2008 |
| JP | 2008-252057 A | 10/2008 |
| JP | 2012-226963 A | 11/2012 |

OTHER PUBLICATIONS

Novoselov, et al., "Electric Field Effect in Atomically Thin Carbon Films", Science, vol. 306, Oct. 22, 2004, pp. 666-669.

Tadatsugu Minami, "Transparent conducting oxide semiconductors for transparent electrodes", Semicond. Sci. Technol., vol. 20, 2005, pp. S35-S44.

Telle et al., "Boride-based nano-laminates with MAX-phase-like behaviour", Journal of Solid State Chemistry, vol. 179, 2006, pp. 2850-2857.

Wang et al., "Electronics and optoelectronics of two-dimensional transition metal dichalcogenides", Nature Nanotechnology, vol. 7, Nov. 6, 2012, pp. 699-712.

Wassei et al., "Graphene, a promising transparent conductor", Materials Today, vol. 13, No. 3, Mar. 2010, pp. 52-59.

* cited by examiner

TRANSPARENT CONDUCTOR AND ELECTRONIC DEVICE INCLUDING THE SAME

RELATED APPLICATION

This application claims priority to and the benefit of Korean Patent Application No. 10-2014-0062572, filed in the Korean Intellectual Property Office on May 23, 2014, the entire contents of which are incorporated herein by reference.

BACKGROUND

1. Field

A transparent conductor and an electronic device are disclosed.

2. Description of the Related Art

An electronic device such as a liquid crystal display ("LCD"), an organic light emitting diode device, and a touch panel screen includes a transparent conductor as a transparent electrode.

The transparent conductor may be broadly classified into three kinds according to the material. The first is an organic-based transparent conductor such as a conductive polymer; the second is an oxide-based transparent conductor such as indium tin oxide ("ITO"); and the third is a metal-based transparent conductor such as a metal grid.

However, the conductive polymer has high specific resistance and low transparency and may be easily deteriorated when exposed to moisture and air. The indium tin oxide ("ITO") may increase the manufacturing cost due to the expensive indium, which is an essential element of ITO, and may lose flexibility limiting application to a flexible device. The metal-based transparent conductor may increase the manufacturing cost due to the complicated manufacturing process. Thus there remains a need for an improved transparent conductor.

SUMMARY

An embodiment provides a transparent conductor which is flexible and is easily applied in a process, and provides low specific resistance and high transparency.

Another embodiment provides an electronic device including the transparent conductor.

According to an embodiment, disclosed is a transparent conductor including a compound including a Group 5 transition metal and boron, wherein the compound has a layered structure.

The compound may be represented by the following Chemical Formula 1.

  Chemical Formula 1

In Chemical Formula 1, M is vanadium (V), niobium (Nb), tantalum (Ta), or a combination thereof, B is boron, and x and y are stoichiometric ratios of M and B.

The x and y of Chemical Formula 1 may satisfy x≤y.

The ratio of the x and y of Chemical Formula 1 may be about 2:3, about 3:4, about 1:1, about 1:2, and about 5:6.

The compound may include $V_2B_3$, $Nb_2B_3$, $Ta_2B_3$, $V_3B_4$, $Nb_3B_4$, $Ta_3B_4$, VB, NbB, TaB, $VB_2$, $NbB_2$, $TaB_2$, $V_5B_6$, $Nb_5B_6$, $Ta_5B_6$, or a combination thereof.

The layered structure may include a plurality of unit crystal layers.

Each unit crystal layer may include an upper layer and a lower layer, each consisting of the Group 5 transition metal, and wherein boron is disposed between the upper layer and the lower layer.

In the layered structure, a unit crystal layer consisting of the transition metal of Group 5 and a unit crystal layer consisting of the boron may be alternatively positioned.

The unit crystal layers may have an interlayer bonding force of less than about 0.45 electron volts per angstrom (eV/Å).

The transparent conductor may have a product of an extinction coefficient (α) at a wavelength of 550 nanometers (nm) and specific resistance (ρ) of less than about 25 at 25° C.

The transparent conductor may have sheet resistance of less than about 200 ohms per square (Ω/sq.) under a light transmittance of greater than or equal to 90 percent (%).

The transparent conductor may include a plurality of nanosheets having a thickness of less than or equal to about 10 nm, and the nanosheets may be connected to each other to provide an electrical connection.

The compound may have exfoliation characteristics.

The transparent conductor may have a thickness of less than or equal to about 100 nm.

According to another embodiment, an electronic device including the transparent conductor is provided.

The electronic device may be a flat panel display, a touch panel screen, a solar cell, an e-window, a heat mirror, or a transparent transistor.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
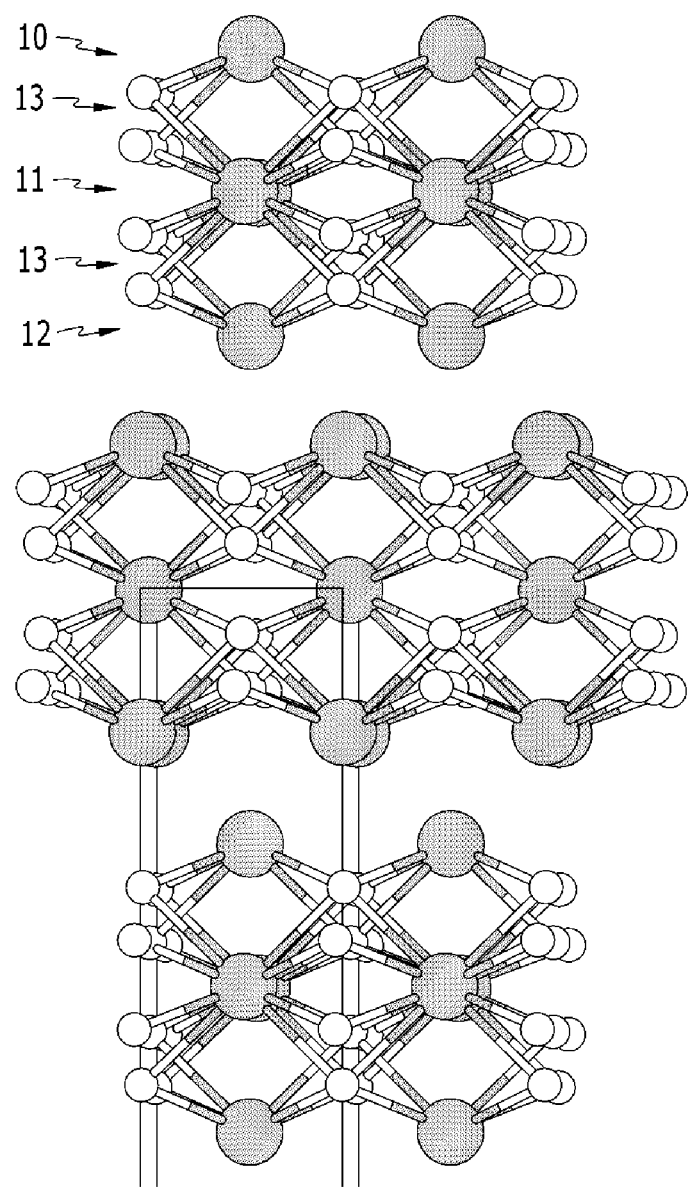
FIGS. 1 to 3 are drawings showing a crystal structure of the transparent conductor depending on a composition ratio between Nb and B.

Exemplary embodiments will hereinafter be disclosed in further detail, and may be easily performed by those who have knowledge in the related art. However, this disclosure may be embodied in many different forms and is not construed as limited to the exemplary embodiments set forth herein. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a transparent conductor according to an embodiment is further disclosed.

A transparent conductor according to an embodiment comprises a compound having a layered structure and comprises a Group 5 transition metal and boron.

The compound may be represented by the following Chemical Formula 1.

$$M_xB_y \hspace{4cm} \text{Chemical Formula 1}$$

In Chemical Formula 1,

M is a Group 5 transition metal, for example vanadium (V), niobium (Nb), tantalum (Ta), or a combination thereof, B is boron, and x and y are stoichiometric ratios of M and B.

The x and y of Chemical Formula 1 may independently be integers and may, for example, satisfy x≤y. For example, the ratio of the x and y of Chemical Formula 1 may be about 2:3, about 3:4, about 1:1, about 1:2, or about 5:6. In an embodiment, the x is about 1 to about 5, and y is independently about 1 to about 6.

The compound may include $V_2B_3$, $Nb_2B_3$, $Ta_2B_3$, $V_3B_4$, $Nb_3B_4$, $Ta_3B_4$, VB, NbB, TaB, $VB_2$, $NbB_2$, $TaB_2$, $V_5B_6$, $Nb_5B_6$, $Ta_5B_6$ or a combination thereof.

The compound has a layered structure, wherein the layered structure is a structure in which layers comprise strongly bound and closely arranged atoms, the layer comprising a plurality of Group 5 transition metal atoms, a plurality of boron atoms, or a plurality of Group 5 transition metal atoms and a plurality of boron atoms. The layers are overlapped and are in parallel, and a weak binding force, such as a van der Waals force, is present between the layers.

The layers of the layered structure may slide because of the weak binding force between layers, so that the compound may be exfoliated to provide a unit crystal layer comprising single layer, or a unit crystal layer comprising several hundred layers, to provide a plurality of unit crystal layers having thickness dimensions of several nanometers to several hundred nanometers, e.g., 5 nm to 500 nm, or 10 nm to 100 nm. It is possible to provide a transparent conductive layer with a suitable and thin thickness by the exfoliation and to easily perform a solution process such as an inking process to provide exfoliated layers. In addition, the flexibility of the conductor may be ensured by the exfoliation. A compound that can provide layers by exfoliation is said to be exfoliable.

The unit crystal layers may have an interlayer bonding force of less than about 0.45 electron volts per Angstrom (eV/Å). The unit crystal layers have the weak interlayer bonding force and thus may be easily exfoliated. The unit crystal layers may have, for example, an interlayer bonding force of less than about 0.41 eV/Å, and specifically, less than about 0.25 eV/Å, or about 0.01 eV/Å to about 0.25 eV/Å, within the range.

The layered structure may have various crystal structures.

For example, each unit crystal layer may include an upper layer 10, an intermediate layer 11, and a lower layer 12, each consisting of the Group 5 transition metal, and a layer consisting of boron 13 positioned between each of the upper layer 1, the intermediate layer 2, and the lower layer 3.

Alternatively, the unit crystal layer may consist of an upper layer 21 and a lower layer 22, each consisting of the Group 5 transition metal, and a layer consisting of boron 23 disposed between the upper layer 21 and the lower layer 22.

As another example, a unit crystal layer consisting of the Group 5 transition metal 31 and a unit crystal layer consisting of the boron 32 are alternatively positioned to form the layered structure.

Alternatively, each unit crystal layer may include an upper layer 10, an intermediate layer 11, and a lower layer 12, each comprising the Group 5 transition metal, and a layer comprising boron 13 positioned between each of the upper layer 1, the intermediate layer 2, and the lower layer 3.

Alternatively, the unit crystal layer may comprise an upper layer 21 and a lower layer 22, each comprising the Group 5 transition metal, and a layer comprising boron 23 disposed between the upper layer 21 and the lower layer 22.

As another example, a unit crystal layer comprising the Group 5 transition metal 31 and a unit crystal layer comprising the boron 32 are alternatively positioned to form the layered structure.

The unit crystal layer consisting of the Group 5 transition metal may have an orthorhombic system, and the unit crystal layer consisting of the boron may have a hexagonal system.

Figure 2:
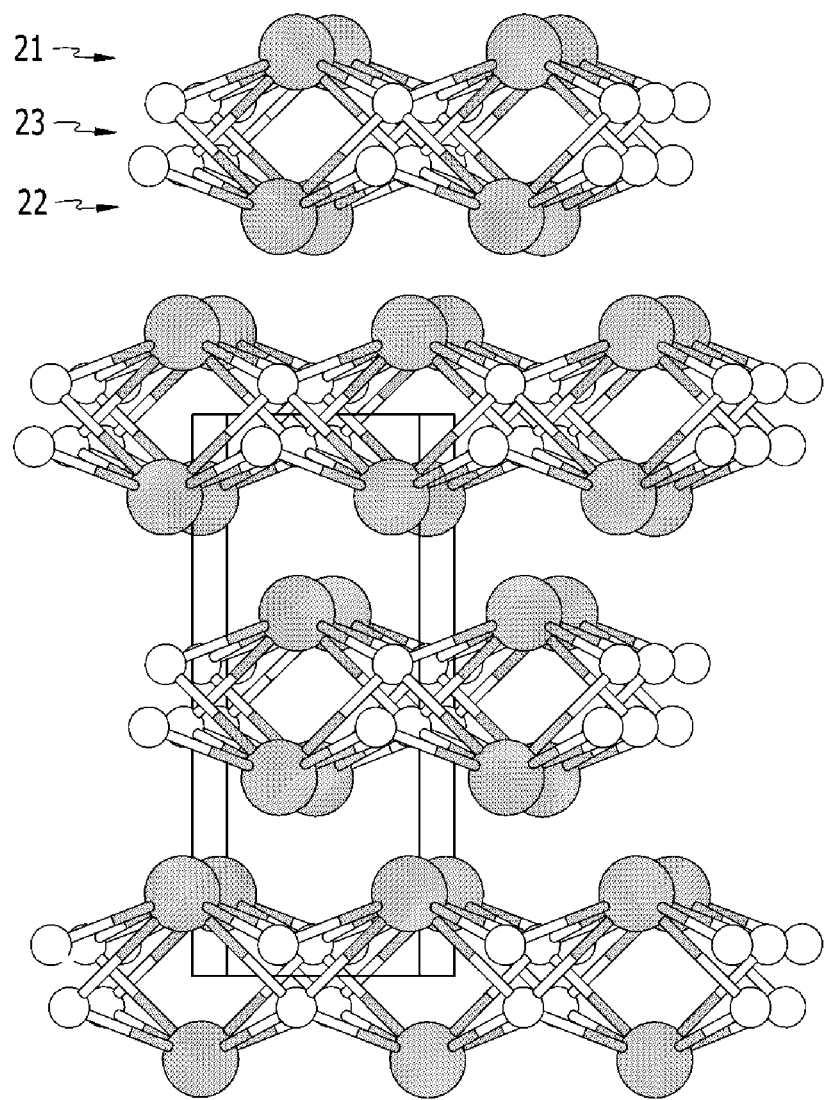
Figure 3:
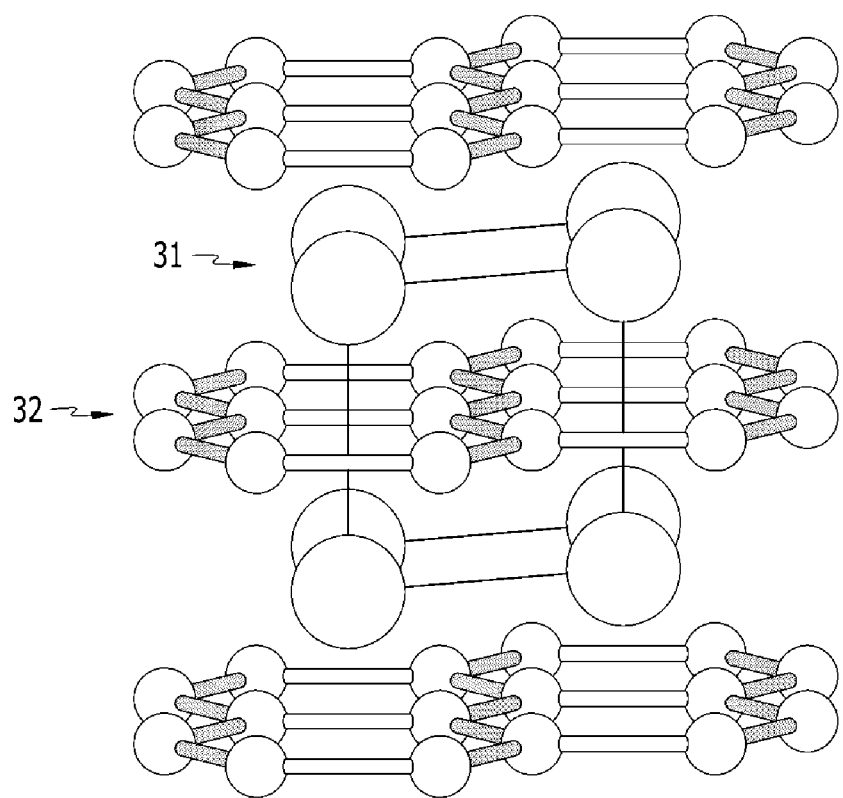
Figure 4:
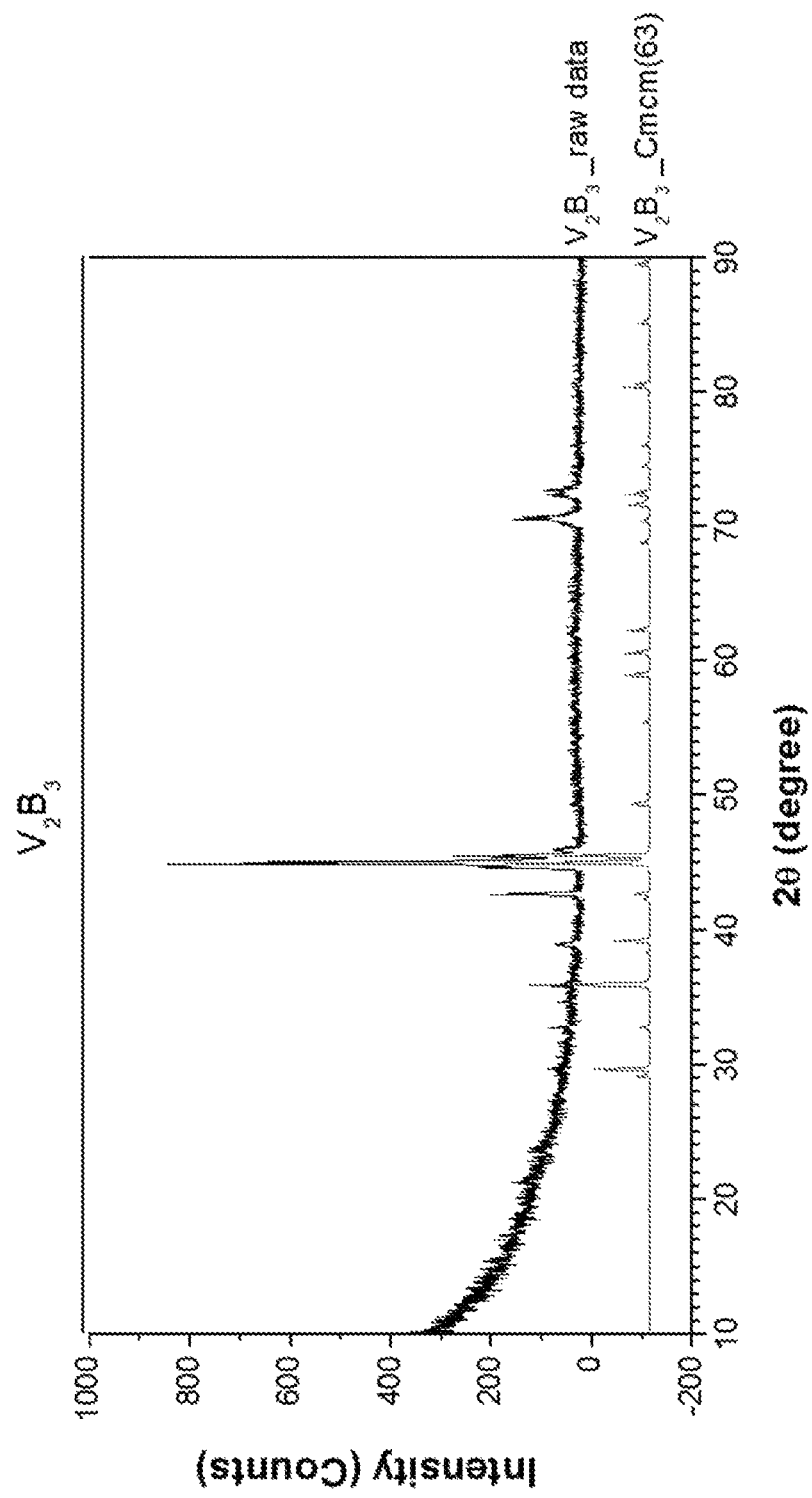
FIGS. 4 to 13 are graphs of intensity (counts) versus diffraction angle (2θ) showing X-ray diffraction ("XRD") results for compounds according to Synthesis Examples 1 to 10.
Figure 5:
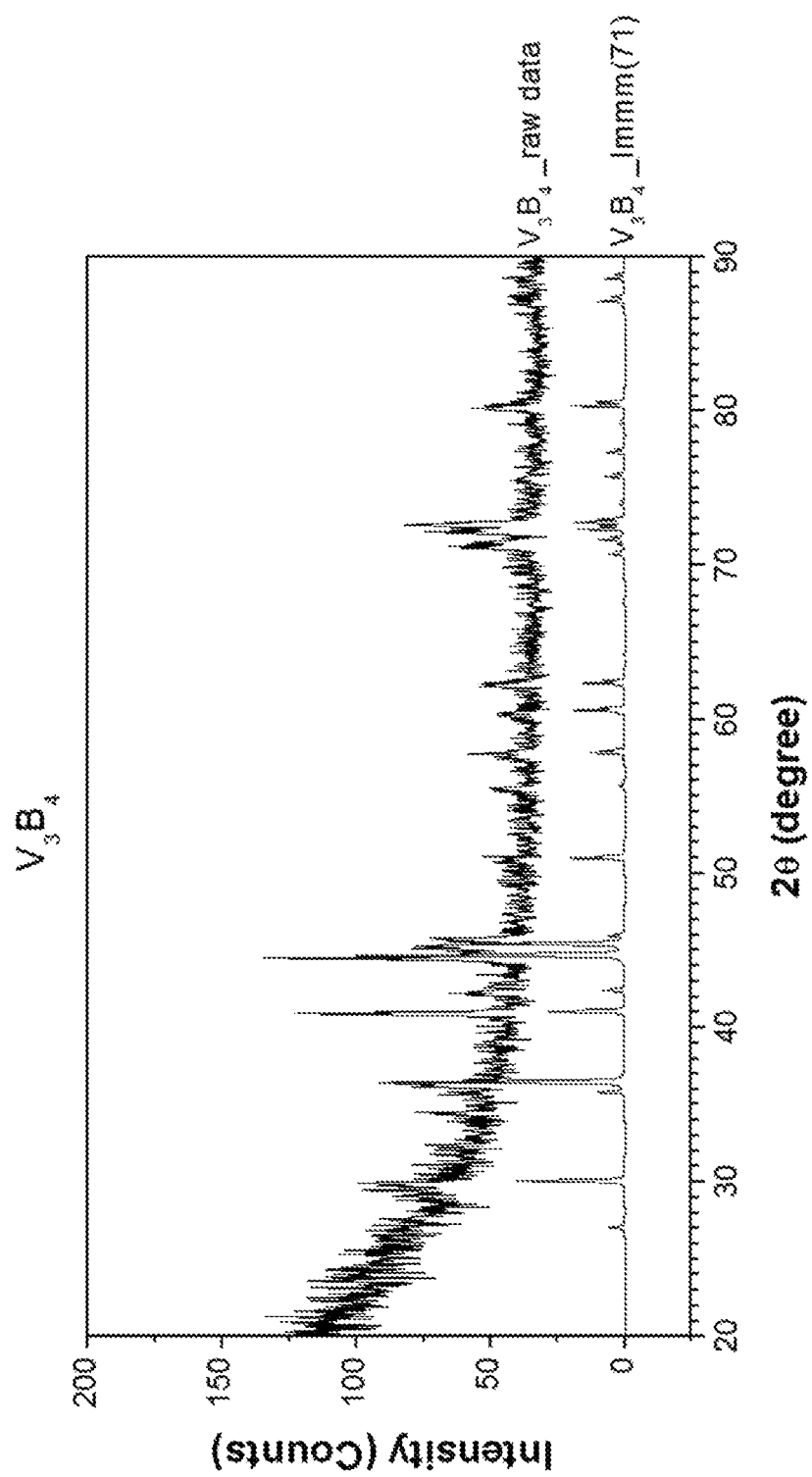
Figure 6:
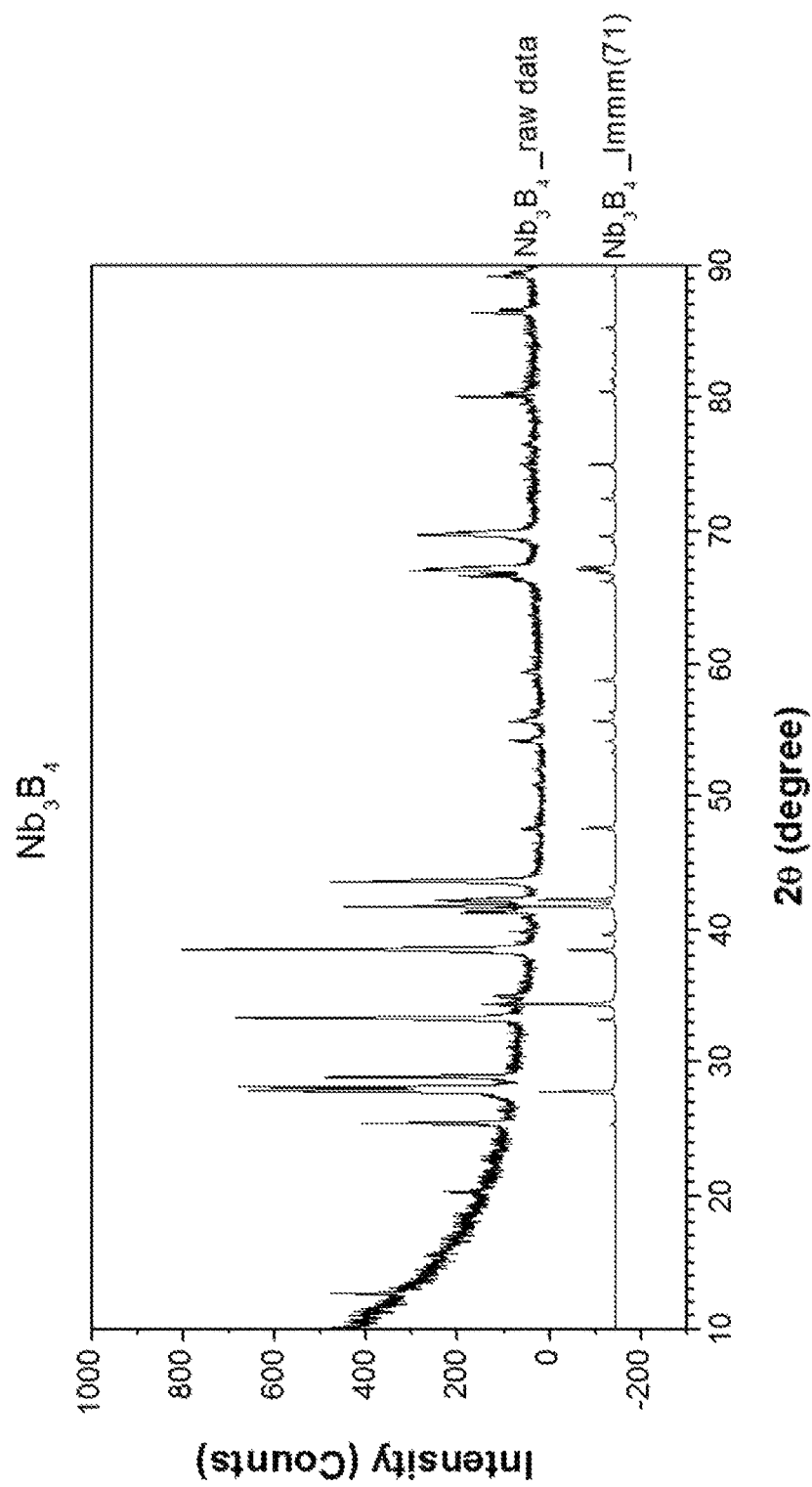
Figure 7:
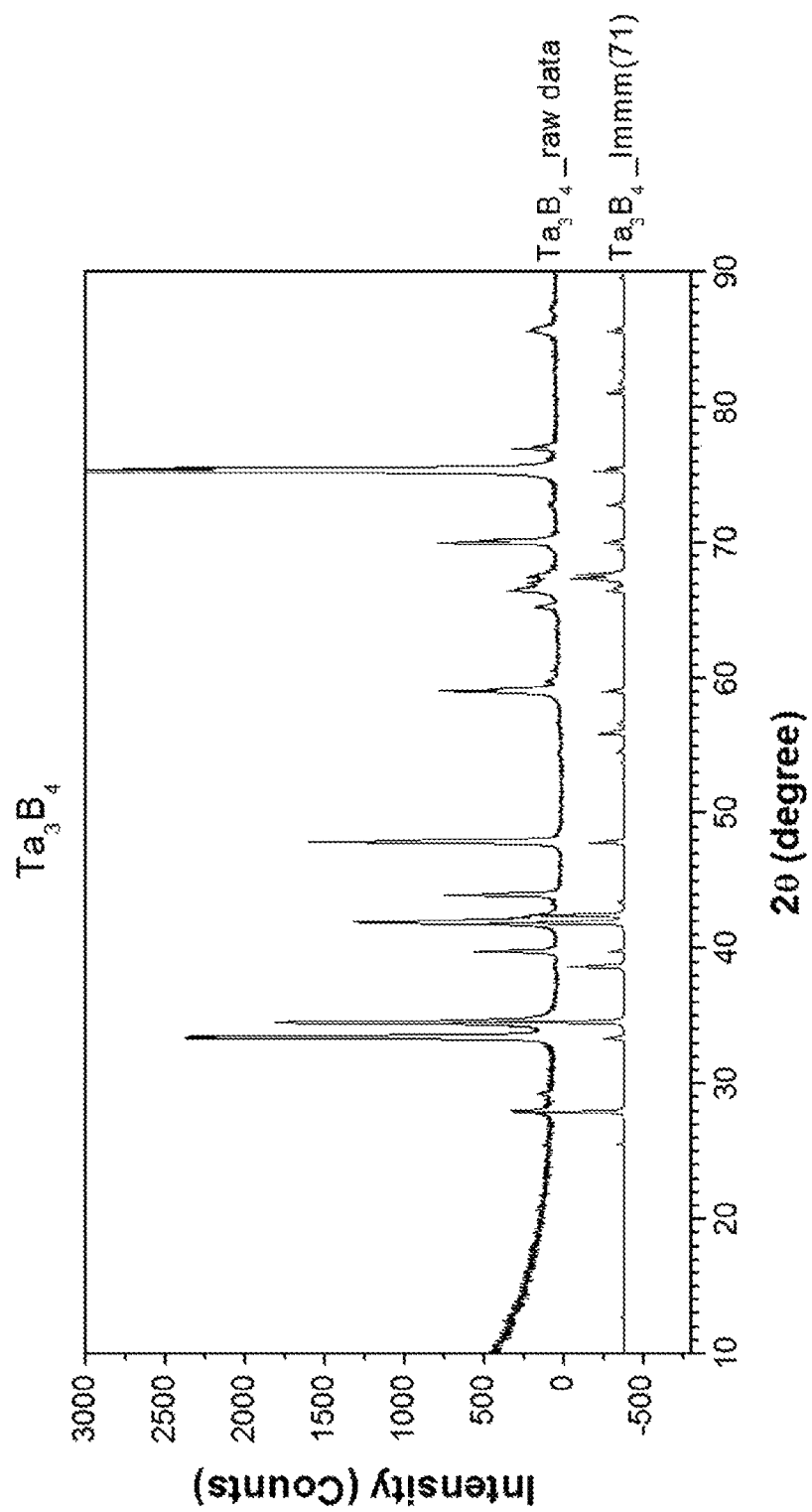
Figure 8:
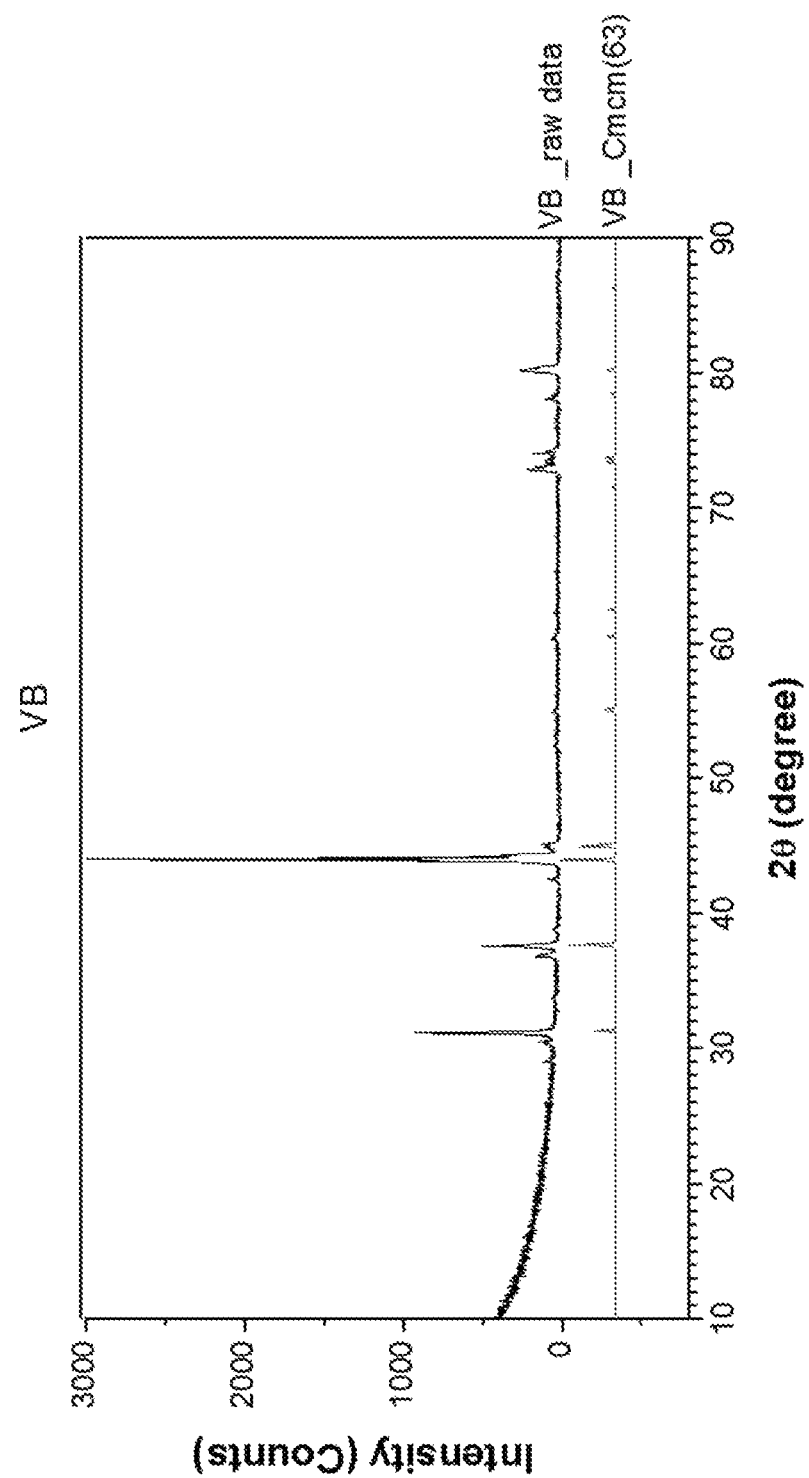
Figure 9:
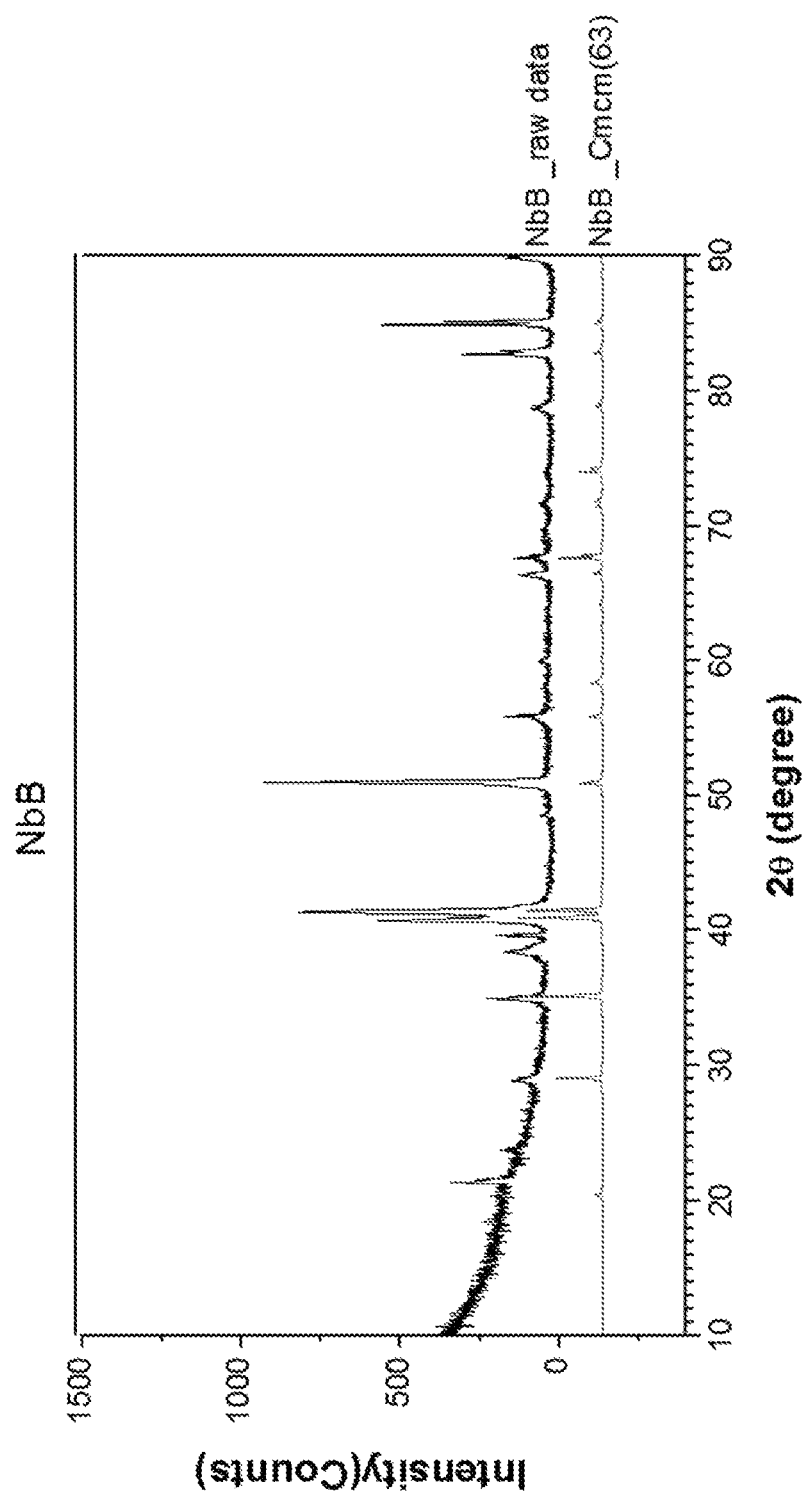
Figure 10:
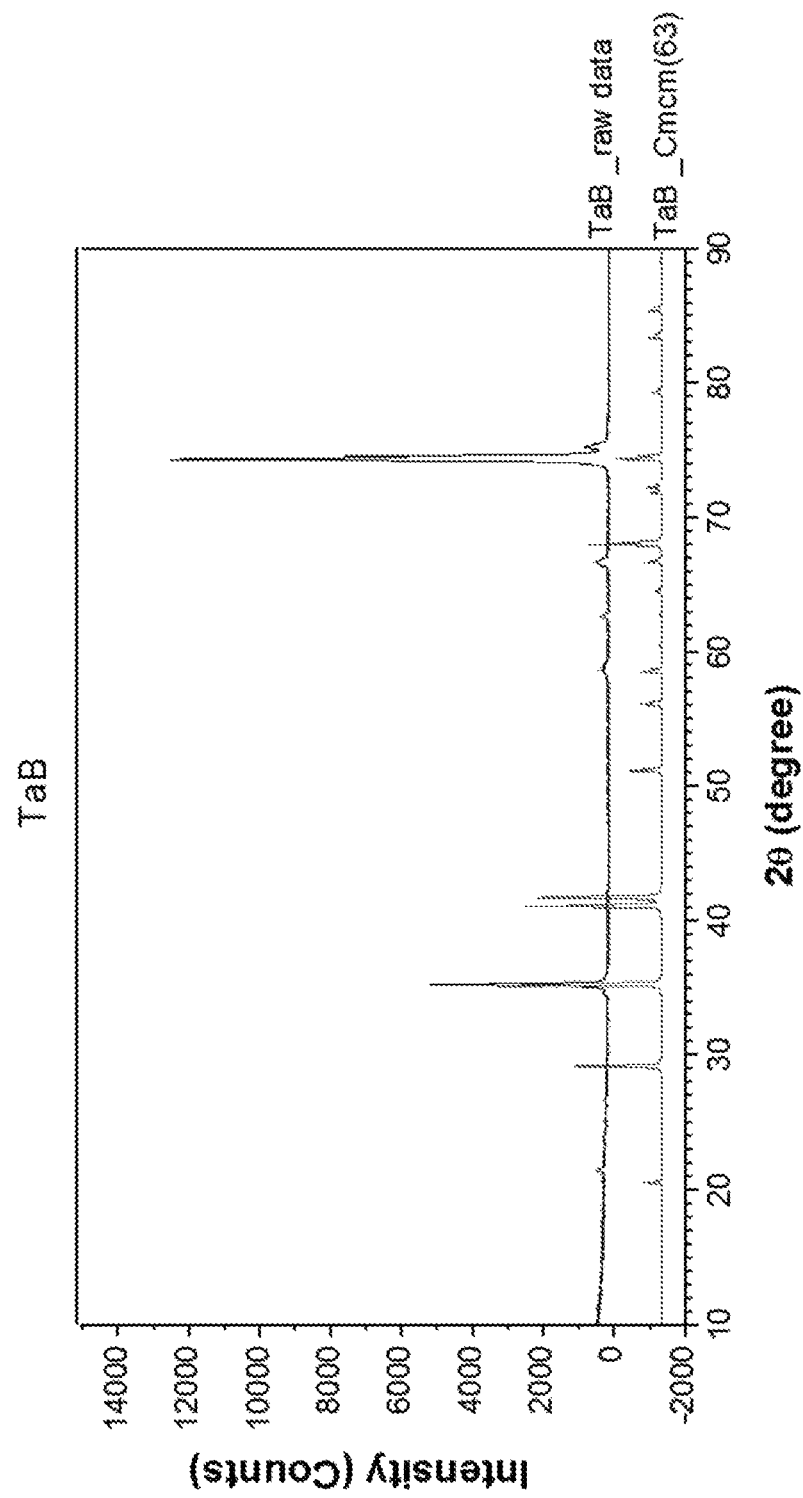
Figure 11:
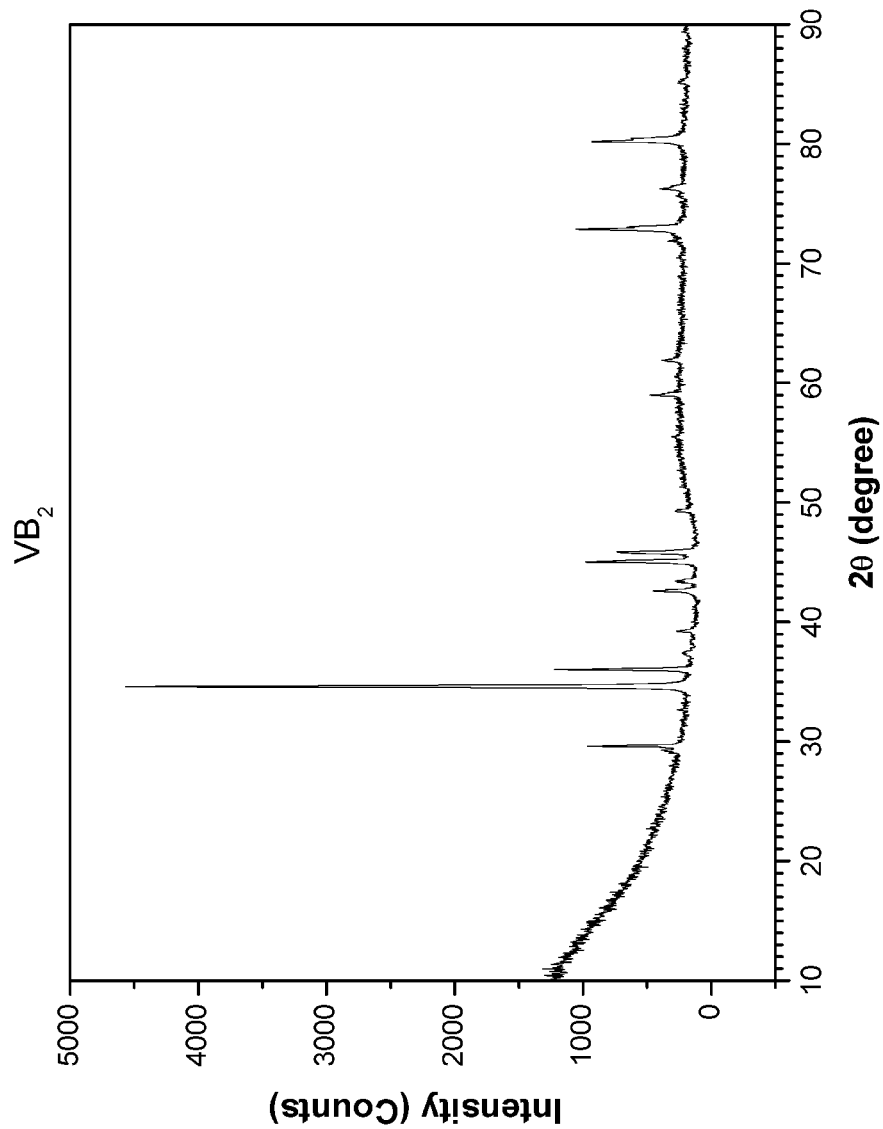
Figure 12:
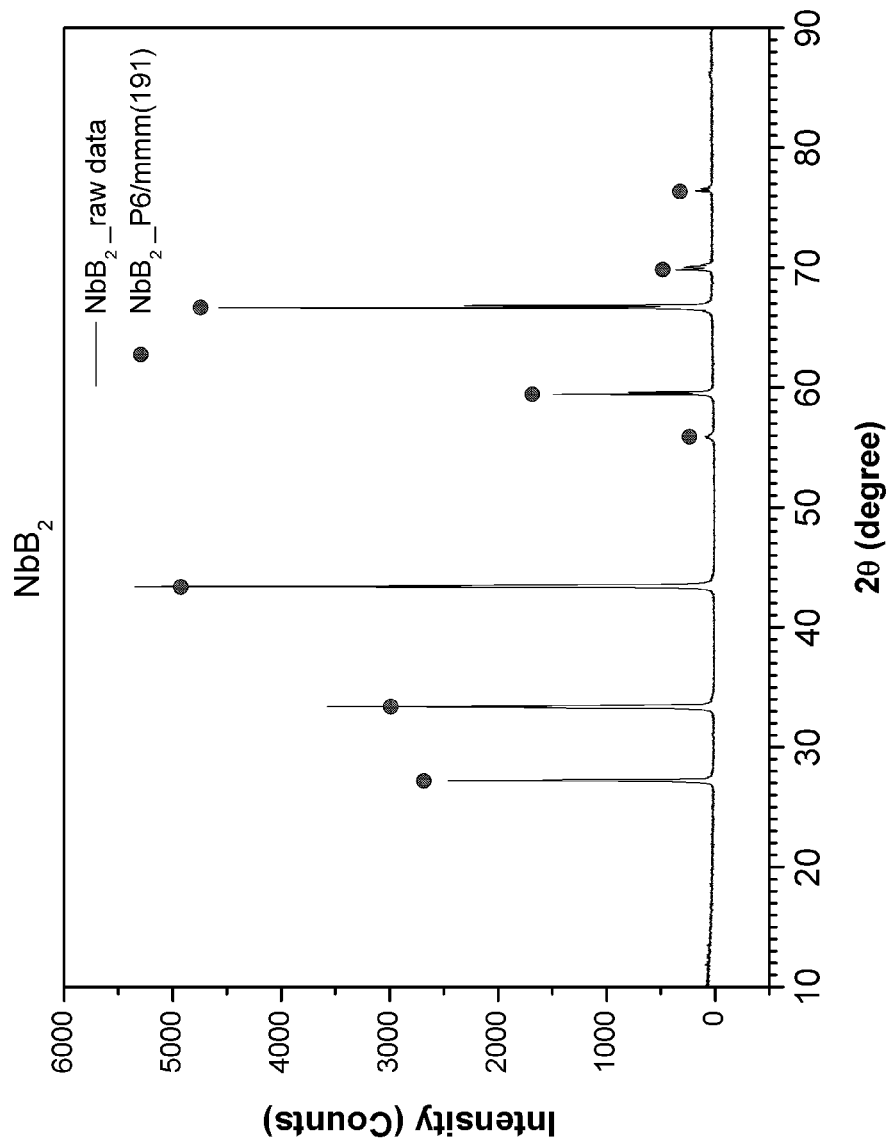
Figure 13:
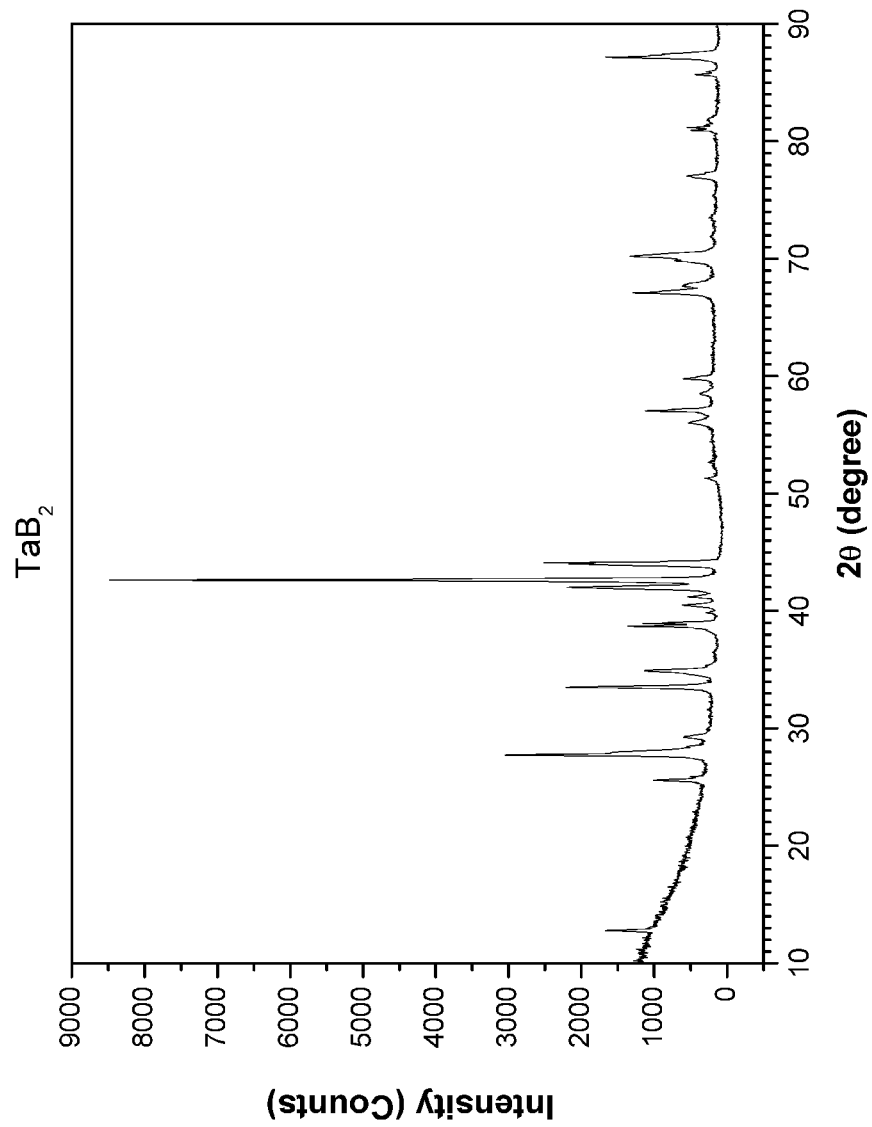

FIGS. 1 to 3 are drawings respectively showing a crystal structure depending on a composition ratio between niobium (Nb), which is a transition metal belonging to Group 5, and boron (B).

FIGS. 1 to 3 show the crystal structure developed with the Vesta program using atom arrangement data from the Inorganic Crystal Structure Database ("ICSD").

FIG. 1 shows the crystal structure of $Nb_3N_4$ having an orthorhombic system/lmmm (71), FIG. 2 shows the crystal structure of NbB having an orthorhombic system/Cmcm (63), and FIG. 3 shows the crystal structure of $NbB_2$ having a hexagonal system/P6/mmm (191).

As shown in FIGS. 1 to 3, a compound having the composition including the transition metal of Group 5 and the boron has a two-dimensional layered structure. In addition, the compound may have various crystal structures depending on a composition ratio between the Group 5 transition metal and the boron, and thus, the composition ratio may be selected to control a distance and/or bonding energy between layers to improve exfoliation characteristics.

The transparent conductor may provide sufficient electrical conductivity and light transmittance for application as a transparent electrode for an electronic device, for example, an electrical conductivity of greater than or equal to about 10000 Siemens per centimeter (S/cm) and light transmittance of greater than or equal to about 80%.

For example, the transparent conductor may have a product of an extinction coefficient ($\alpha$) at a wavelength of 550 nm and specific resistance ($\rho$) of less than about 25 at 25° C. When the product is within the range, electrical conductivity and light transmittance may be simultaneously satisfied. The product may be less than 22, less than about 21, or less than about 18, or about 5 to about 25, within the range.

For example, when the transparent conductor has light transmittance of greater than or equal to about 90%, the transparent conductor has sheet resistance of less than about 200 ohms per square ($\Omega$/sq). When the transparent conductor as a light transmittance within the range, suitable electrical conductivity may be provided.

For example, when the transparent conductor has a thickness of less than or equal to about 10 nm, light transmittance of greater than or equal to about 80% may be provided.

The following Table 1 shows electrical conductivity ($\sigma$), specific resistance ($\rho$), an extinction coefficient ($\alpha$), a product of the specific resistance ($\rho$) and the extinction coefficient ($\alpha$), and sheet resistance (Rs) of a compound represented by Chemical Formula 1.

TABLE 1

| | Electrical conductivity ($\sigma$, S/cm) | Specific resistance ($\rho$, $\Omega$/cm) | Extinction coefficient ($\alpha$, cm$^{-1}$) | $\alpha*\rho$ ($\Omega$/sq.) | Sheet resistance (Rs, $\Omega$/sq., T ≥ 90%) |
|---|---|---|---|---|---|
| $V_2B_3$ | 4.29E+04 | 2.33E−05 | 6.0E+05 | 14.026 | 133.1 |
| $Nb_2B_3$ | 6.60E+04 | 1.52E−05 | 5.6E+05 | 8.522 | 80.9 |
| $Ta_2B_3$ | 7.31E+04 | 1.37E−05 | 5.7E+05 | 7.762 | 73.7 |
| VB | 2.96E+04 | 3.38E−05 | 5.2E+05 | 17.421 | 165.3 |
| NbB | 4.20E+04 | 2.38E−05 | 5.3E+05 | 12.559 | 119.2 |
| TaB | 4.62E+04 | 2.16E−05 | 5.5E+05 | 11.932 | 113.2 |
| $V_3B_4$ | 4.34E+04 | 2.30E−05 | 6.0E+05 | 13.737 | 130.4 |
| $Nb_3B_4$ | 6.25E+04 | 1.60E−05 | 5.2E+05 | 8.316 | 78.9 |
| $Ta_3B_4$ | 6.83E+04 | 1.46E−05 | 5.1E+05 | 7.404 | 70.3 |
| $VB_2$ | 1.02E+05 | 9.82E−06 | 5.48E+05 | 5.381 | 51.1 |
| $NbB_2$ | 1.38E+05 | 7.27E−06 | 5.46E+05 | 3.969 | 37.7 |
| $TaB_2$ | 1.72E+05 | 5.8E−06 | 6.02E+05 | 3.492 | 33.1 |
| $V_5B_6$ | 2.91E+04 | 3.44E−05 | 6.0E+05 | 20.481 | 194.4 |
| $Nb_5B_6$ | 4.51E+04 | 2.21E−05 | 5.4E+05 | 12.022 | 114.1 |
| $Ta_5B_6$ | 5.05E+04 | 1.98E−05 | 5.6E+05 | 11.085 | 105.2 |

In Table 1, scientific notation is presenting using E notation, wherein E represents "times ten raised to the power of" and is followed by the value of the exponent. Thus 4.29E+04 represents 4.29·10$^4$.

Table 1 shows electrical conductivity and an extinction coefficient calculated according to the following method and sequence, and sequentially a simulation process, and also sheet resistance calculated under transmittance of greater than or equal to about 90% when each compound is applied. The simulation program VASP and Boltztrap is used.

A band structure of a material is calculated through a first-principles electronic structure calculation.

Conductivity and plasma frequency are calculated by calculating intra-band transition by free electrons from the band structure.

Inter-band transition is calculated by bound electrons from the band structure.

A dielectric function is calculated by considering the free electrons and the bound electrons.

The square root of the dielectric function is taken to calculate a complex refractive function (n+ik), and then a refractive index for visible light and an absorption rate for the visible light are calculated from the refractive function.

The transparent conductor may be prepared as a transparent thin film by preparing a powder from, for example, a raw material of the compound, a polycrystalline or monocrystalline bulk material obtained therefrom, or a powder obtained from the bulk material; and providing a transparent thin film from the raw material, the obtained bulk material, or the powder thereof according to deposition and the like.

The polycrystalline bulk material may be prepared from the raw material using, for example, a quartz ampoule method, an arc melting method, a solid-state reaction method, or the like. The raw material may be, for example, a Group 5 transition metal selected from vanadium (V), niobium (Nb), tantalum (Ta), or a combination thereof, and boron, and may be formed as a powder. For example, the quartz ampoule method may include: inputting the raw material into a quartz tube or a metal ampoule; sealing the same under vacuum; and heating and subjecting the same to a solid state reaction or a fusion reaction. The arc melting method may include: inputting the raw material into a chamber; arc discharging the same under an inert gas atmosphere; fusing the raw material; and solidifying the same. The solid state reaction method may be performed by mixing the raw material to provide a pellet and heating the same, or mixing the raw material and heating the same to provide a pellet.

The obtained polycrystalline bulk material may be highly densified by sintering or the like. The highly densified material may be used as a specimen for measuring electric conductivity. The high densification may be performed by a hot press method, a spark plasma sintering method, a hot forging method, or the like, but is not limited thereto. The hot press method shapes by inputting the raw material into a mold having a predetermined shape and shaping at a high temperature, for example, of about 300° C. to about 800° C. under high pressure, for example, of about 30 Pascals (Pa) to about 300 megaPascals (MPa). The spark plasma sintering method may include flowing a current of, for example, about 50 amperes (A) to about 500 A into the raw material under a pressure of, for example, about 30 MPa to about 300 MPa, and sintering the material within a short time. The hot forging method may include pressing and sintering the raw material at a high temperature of, for example, about 300° C. to about 700° C.

The single crystal bulk material may be obtained by providing crystal ingots or growing single crystals.

The crystal ingot may be obtained by heating the congruent melting material at a temperature of higher than the melting point and slowly cooling the same. For example, the raw materials are mixed and input into a quartz ampoule, the ampoule is sealed under vacuum to melt the mixture, and then the melted solution is slowly cooled to provide a crystal ingot. In this case, the size of the crystal particle may be controlled by adjusting the cooling speed of melted solution.

The single crystal growth may be performed by a metal flux method, a Bridgman method, an optical floating zone method, a vapor transport method, or the like.

The metal flux method may include introducing the mixture into a crucible and heat-treating the same at a high temperature under an atmosphere in which the raw material may be grown to a crystal at a high temperature to grow the crystal.

The Bridgman method may include: introducing the raw material into a crucible; heating the raw material at a high temperature until the raw material is dissolved from the end of the crucible; slowly transporting the high temperature zone and locally melting the sample; and passing the entire sample through the high temperature zone to grow the crystal.

The optical floating region method may include: forming the raw material into a seed rod and a feed rod having a rod shape; focusing a lamp light onto the feed rod and locally dissolving the sample at a high temperature; and slowly pulling up the dissolved part to grow the crystal.

The vapor transport method may include: introducing the raw material into a bottom part of a quartz tube; and heating the raw material and leaving the upper part of the quartz tube at a low temperature to gasify the raw material causing a solid-phase reaction at a low temperature. The electrical conductivity of the obtained single crystal material may be measured according to, for example, a direct current four-probe method.

The obtained single crystal or polycrystalline bulk material is pulverized to provide a crystal powder. The pulverization may be performed by any method such as ball milling without specific limitations. After the pulverization, a powder having a uniform size may be provided using, for example, a sieve.

The obtained polycrystalline or single crystal bulk material may be used as a target for vapor deposition to provide a thin film including the compound. The vapor deposition may be performed by, for example, a physical vapor deposition method such as thermal evaporation and sputtering, a chemical vapor deposition method, an atomic layer deposition ("ALD") method, or a pulsed laser deposition method. The deposition may be performed by using any known or commercially available devices. The conditions of deposition may be changed according to the kind of compound and the deposition method, and are not particularly limited.

Alternatively, the transparent conductor may be produced into a transparent thin film by preparing, for example, a plurality of nanosheets from the bulk material powder by liquid phase exfoliation and inking the obtained nanosheets. Each nanosheet may have, for example, a thickness of less than or equal to about 10 nm.

The liquid phase exfoliation may be performed by ultrasonicating the bulk material or the powder obtained from the bulk material in an appropriate solvent. The solvent may be, for example, water, alcohol (isopropyl alcohol, ethanol, or methanol), N-methylpyrrolidone ("NMP"), hexane, benzene, dichlorobenzene, toluene, chloroform, diethylether, dichloromethane ("DCM"), tetra hydrofuran ("THF"), ethylacetate, acetone, dimethylformamide ("DMF"), acetonitrile ("MeCN"), dimethylsulfoxide ("DMSO"), ethylene carbonate, propylene carbonate, γ-butyrolactone, γ-valerolactone, a perfluorinated aromatic solvent, or a combination thereof, but is not limited thereto.

In addition to the solvent, an additive such as a surfactant and a dispersing agent may be further included in order to facilitate the exfoliation and to prevent aggregation of the exfoliated nanosheets.

The obtained nanosheets may be physically connected to provide an electrical connection. When the nanosheets are physically connected to provide a thin film, the light transmittance may be further enhanced. The nanosheet may be processed into a transparent thin film by, for example, dip coating, spray coating, slit coating, inkjet coating, and the like. The obtained transparent thin film may have coverage of greater than or equal to about 50%, or greater than or equal to about 70% within the range, or greater than or equal to about 90% within the range, and for example, may be about 100%.

The transparent thin film may have a thickness of, for example, less than or equal to about 100 nm. The thickness may range from about 5 nm to about 100 nm within the range, or from about 10 nm to about 80 nm within the range.

The transparent conductor may be applied to an electrode for the various electronic devices. Examples of the electronic devices may include a flat panel display such as a liquid crystal display ("LCD"), an organic light emitting diode device, a touch panel screen, a solar cell, an e-window, a heat mirror, or a transparent transistor, but is not limited thereto. In addition, as the transparent conductor has sufficient flexibility as described above, it may be usefully applied to a flexible electronic device.

Hereinafter, as an example of the electronic device, an organic light emitting diode device in which the transparent conductor is applied to a transparent electrode is described with reference to the drawings.

Figure 14:
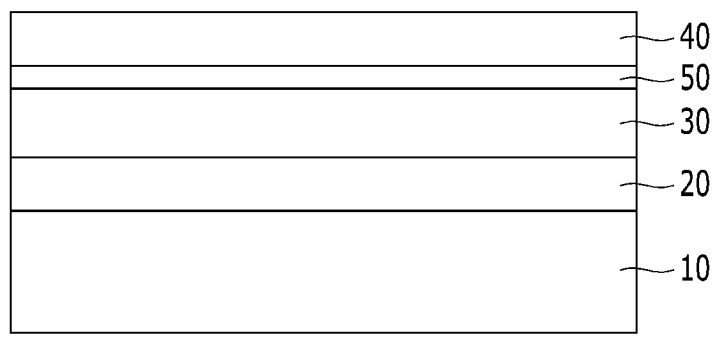
FIG. 14 is a schematic cross-sectional view of an embodiment of an organic light emitting diode device.

FIG. 14 is a schematic cross-sectional view showing an organic light emitting diode device according to an embodiment.

Referring to FIG. 14, the organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may include, for example, an inorganic material such as glass or an organic material such as polycarbonate, polymethylmethacrylate, polyethylene terephthalate, polyethylene naphthalate, polyamide, polyethersulfone, or a combination thereof, a silicon wafer, and the like.

One of the lower electrode 20 and the upper electrode 40 is a cathode, and the other is an anode. For example, the lower electrode 20 may be an anode, and the upper electrode 40 may be a cathode.

At least either one of the lower electrode 20 and the upper electrode 40 is transparent. When the lower electrode 10 is transparent, an organic light emitting diode device may be a bottom emission type in which light is emitted toward the substrate 10, while when the upper electrode 40 is transparent, the organic light emitting diode device may be a top emission type in which light is emitted toward the opposite direction of the substrate 10. In addition, when the lower electrode 20 and upper electrode 40 are both transparent, light may be emitted both toward the substrate 10 and toward the opposite direction of the substrate 10.

The transparent electrode is comprises transparent conductor. The transparent conductor may be the same as described above.

The emission layer 30 may be made of an organic material emitting one light among primary colors such as red, green, blue, and the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a coumarin-based pigment, a rothermine-based pigment, rubrene, perylene, 9,10-diphenylanthracene, tetraphenylbutadiene, Nile red, coumarin, quinacridone, and the like. An organic light emitting diode device displays a desirable image by a spatial combination of primary colors emitted by an emission layer therein.

The emission layer 30 may emit white light by combining three primary colors such as red, green, and blue. Specifically, the emission layer 30 may emit white light by combining colors of neighboring sub-pixels or by combining laminated colors in a vertical direction.

An auxiliary layer 50 may be positioned between the emission layer 30 and the upper electrode 40 to improve luminous efficiency. In the drawing, the auxiliary layer 50 is shown only between the emission layer 30 and the upper electrode 40, but is not limited thereto, and may be positioned between and emission layer 30 and the lower electrode 20, or may be positioned between the emission layer 30 and the upper electrode 40, and between the emission layer 30 and the lower electrode 20.

The auxiliary layer 50 may include an electron transport layer ("ETL") and a hole transport layer ("HTL") for balancing between electrons and holes, an electron injection layer ("EIL"), a hole injection layer ("HIL") for reinforcing injection of electrons and holes, and the like. It may include one or more layers selected therefrom.

The case in which the transparent conductor is applied to an organic light emitting diode device is described herein, but is not limited thereto. It may be used for an electrode for all electronic devices including, for example, a pixel electrode and/or a common electrode of a liquid crystal display ("LCD"), a display electrode of a plasma display device, and a transparent electrode of a touch panel device.

Hereinafter, the embodiments are illustrated in more detail with reference to examples. These examples, however, are not in any sense to be interpreted as limiting the scope of this disclosure.

EXAMPLES

Synthesis Examples

Synthesis Example 1

$V_2B_3$ 2.276 g of V powder (purity: 99.95%, manufacturer: LTS) and 0.724 g of B powder (purity: 99.9%, manufacturer: LTS) are mixed in a glove box to prepare a mixture. The mixture is loaded in an arc fusion equipment (Vacuum Arc Furnace, Yein Tech Co., Ltd.) to prepare a sample, and its vacuum degree is maintained to be less than or equal to $10^{-3}$ Torr. Subsequently, after injecting argon gas into the equipment, switching the equipment on, and then moving an arc tip near to the mixture to adjust a distance therebetween to be about 0.5 to 1 cm, an arc is generated. The arc is adjusted to have current intensity ranging from about 200 to 250 A. Subsequently, an arc fusion is uniformly performed by turning over the sample up and down. The sample is then cooled, obtaining a compound of $V_2B_3$.

Synthesis Example 2

$V_3B_4$

A compound of $V_3B_4$ is obtained according to the same method as Synthesis Example 1, except for using 2.338 g of the V powder and 0.662 g of the B powder as raw materials.

Synthesis Example 3

$Nb_3B_4$

A compound of $Nb_3B_4$ is obtained according to the same method as Synthesis Example 1, except for using 2.597 g of Nb powder (purity: 99.95%, manufacturer: LTS) and 0.403 g of B powder (purity: 99.9%, manufacturer: LTS) instead of the V powder and the B powder as raw materials.

Synthesis Example 4

$Ta_3B_4$

A compound of $Ta_3B_4$ is obtained according to the same method as Synthesis Example 1, except for using 2.779 g of Ta powder (purity: 99.95%, manufacturer: LTS) and 0.221 g of B powder (purity: 99.9%, manufacturer: LTS) instead of the V powder and the B powder as raw materials.

Synthesis Example 5

VB

A compound of VB is obtained according to the same method as Synthesis Example 1, except for synthesizing 2.475 g of V powder and 0.525 g of B powder as raw materials.

Synthesis Example 6

NbB

A compound of Nb is obtained according to the same method as Synthesis Example 1, except for synthesizing 2.687 g of Nb powder (purity: 99.95%, manufacturer: LTS) and 0.313 g of B powder (purity: 99.9%, manufacturer: LTS) instead of the V powder and the B powder as raw materials.

Synthesis Example 7

TaB

A compound of TaB is obtained according to the same method as Synthesis Example 1, except for synthesizing 2.831 g of Ta powder (purity: 99.95%, manufacturer: LTS) and 0.169 g of B powder (purity: 99.9%, manufacturer: LTS) instead of the V powder and the B powder as raw materials.

Synthesis Example 8

$VB_2$

A compound of $VB_2$ is obtained according to the same method as Synthesis Example 1, by synthesizing 2.106 g of V powder and 0.894 g of B powder as raw materials.

Synthesis Example 9

$NbB_2$

A compound of $NbB_2$ is obtained according to the same method as Synthesis Example 1, except for synthesizing 2.434 g of Nb powder (purity: 99.95%, manufacturer: LTS) and 0.566 g of B powder (purity: 99.9%, manufacturer: LTS) instead of the V powder and the B powder as raw materials.

Synthesis Example 10

$TaB_2$

A compound of $TaB_2$ is obtained according to the same method as Synthesis Example 1, except for synthesizing 2.680 g of Ta powder (purity: 99.95%, manufacturer: LTS) and 0.320 g of B powder (purity: 99.9%, manufacturer: LTS) instead of the V powder and the B powder as raw materials.

Evaluation
Evaluation 1: XRD

An X-ray diffraction analysis (XRD) is performed to examine the crystal structure of each compound according to Synthesis Examples 1 to 10.

FIGS. 4 to 13 are XRD graphs respectively showing the compounds according to Synthesis Examples 1 to 10.

Referring to FIGS. 4 to 13, the compounds respectively have a single phase, which is a crystal structure shown in the following Table 2.

TABLE 2

|  |  | Crystal structure/Space group |
| --- | --- | --- |
| Synthesis Example 1 | $V_2B_3$ | Orthorhombic/Cmcm 63 |
| Synthesis Example 2 | $V_3B_4$ | Orthorhombic/Immm 71 |
| Synthesis Example 3 | $Nb_3B_4$ | Orthorhombic/Immm 71 |
| Synthesis Example 4 | $Ta_3B_4$ | Orthorhombic/Immm 71 |
| Synthesis Example 5 | VB | Orthorhombic/Cmcm 63 |
| Synthesis Example 6 | NbB | Orthorhombic/Cmcm 63 |

TABLE 2-continued

|  |  | Crystal structure/Space group |
| --- | --- | --- |
| Synthesis Example 7 | TaB | Orthorhombic/Cmcm 63 |
| Synthesis Example 8 | $VB_2$ | Hexagonal/P6/mmm 191 |
| Synthesis Example 9 | $NbB_2$ | Hexagonal/P6/mmm 191 |
| Synthesis Example 10 | $TaB_2$ | Hexagonal/P6/mmm 191 |

Evaluation 2: Electrical Conductivity

Electrical conductivity of the compounds according to Synthesis Examples 1 to 10 is evaluated. The electrical conductivity is obtained through a DC 4-point probe method at room temperature.

The results are provided in Table 3.

TABLE 3

|  |  | Conductivity ($\sigma$, S/cm) |
| --- | --- | --- |
| Synthesis Example 1 | $V_2B_3$ | 30177 |
| Synthesis Example 2 | $V_3B_4$ | 24959 |
| Synthesis Example 3 | $Nb_3B_4$ | 34020 |
| Synthesis Example 4 | $Ta_3B_4$ | 23350 |
| Synthesis Example 5 | VB | 31832 |
| Synthesis Example 6 | NbB | 57717 |
| Synthesis Example 7 | TaB | 14418 |
| Synthesis Example 8 | $VB_2$ | 10565 |
| Synthesis Example 9 | $NbB_2$ | 15896 |
| Synthesis Example 10 | $TaB_2$ | 13969 |
| Comparative Example 1 | ITO | 5000-9000 |

Referring to Table 3, the compounds according to Synthesis Examples 1 to 10 turn out to have high electrical conductivity of greater than or equal to about 10,000 S/cm. In addition, the compounds according to Synthesis Examples 1 to 10 show higher electrical conductivity than ITO that is generally used as a transparent conductor.

Evaluation 3: Interlayer Bonding Force

Interlayer bonding force of the compounds according to Synthesis Examples 1 to 10 is evaluated. The interlayer bonding force is calculated according to a VASP method, and obtained by an energy difference between a bulk structure and a slab structure having a surface.

The results are provided in Table 4.

TABLE 4

|  |  | Interlayer bonding force (eV/Å) |
| --- | --- | --- |
| Synthesis Example 1 | $V_2B_3$ | 0.21 |
| Synthesis Example 2 | $V_3B_4$ | 0.07 |
| Synthesis Example 3 | $Nb_3B_4$ | 0.06 |
| Synthesis Example 4 | $Ta_3B_4$ | 0.07 |
| Synthesis Example 5 | VB | 0.23 |
| Synthesis Example 6 | NbB | 0.19 |
| Synthesis Example 7 | TaB | 0.20 |
| Synthesis Example 8 | $VB_2$ | 0.41 |
| Synthesis Example 9 | $NbB_2$ | 0.37 |
| Synthesis Example 10 | $TaB_2$ | 0.31 |

Referring to Table 4, the compounds according to Synthesis Examples 1 to 10 turn out to have a weak interlayer bonding force of less than about 0.45 eV/Å. Accordingly, the compounds according to Synthesis Examples 1 to 10 are exfoliated along each layer or several layers, since the layers slide against one another due to the weak interlayer bonding force, and thus may form several nanometer units to hundreds of nanometer units of a plurality of unit crystal layers.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A transparent conductor comprising:
a compound comprising a Group 5 transition metal and boron, wherein the compound has a layered structure, the compound is represented by the following Chemical Formula 1:

$$M_xB_y$$ Chemical Formula 1 wherein, in Chemical Formula 1,
M is vanadium, niobium, tantalum, or a combination thereof,
B is boron, and
x and y are stoichiometric ratios of M and B,
the compound comprises $V_2B_3$, $Nb_2B_3$, $Ta_2B_3$, $V_3B_4$, $Nb_3B_4$, $Ta_3B_4$, VB, NbB, TaB, $V_5B_6$, $Nb_5B_6$, $Ta_5B_6$, or a combination thereof,
wherein the compound is in a form of a plurality of exfoliated nanosheets having a thickness of less than or equal to about 10 nanometers,
wherein the nanosheets contact one another and provide an electrical connection,
wherein the layered structure comprises a plurality of unit crystal layers,
wherein each unit crystal layer comprises an upper layer and a lower layer, each consisting of the Group 5 transition metal and boron disposed between the upper layer and the lower layer, and
wherein the unit crystal layers have an interlayer bonding force of less than 0.25 electron volts per Angstrom.

2. The transparent conductor of claim 1, wherein a product of an extinction coefficient at a wavelength of 550 nanometers and specific resistance is less than 25 at 25° C.

3. The transparent conductor of claim 1, which has sheet resistance of less than 200 ohms per square and a light transmittance of greater than or equal to 90 percent.

4. The transparent conductor of claim 1, which has a thickness of less than or equal to about 100 nanometers.

5. An electronic device including the transparent conductor of claim 1.

6. The electronic device of claim 5, wherein the electronic device is a flat panel display, a touch panel screen, a solar cell, an e-window, a heat mirror, or a transparent transistor.

* * * * *